(12) United States Patent
Yamaguchi et al.

(10) Patent No.: US 7,393,392 B2
(45) Date of Patent: Jul. 1, 2008

(54) HYDROGEN-PERMEABLE MEMBRANE AND PROCESS FOR PRODUCTION THEREOF

(75) Inventors: Akira Yamaguchi, Iwate (JP); Katsuhiko Fukui, Iwate (JP)

(73) Assignee: Mikuni Corporation, Chiyoda-Ku, Tokyo (JP)

( * ) Notice: Subject to any disclaimer, the term of this patent is extended or adjusted under 35 U.S.C. 154(b) by 495 days.

(21) Appl. No.: 11/057,741

(22) Filed: Feb. 14, 2005

(65) Prior Publication Data

US 2005/0188845 A1    Sep. 1, 2005

(30) Foreign Application Priority Data

Feb. 27, 2004    (JP) .............................. 2004-055184

(51) Int. Cl.
*B01D 53/22* (2006.01)
(52) U.S. Cl. ............................ 96/11; 96/4; 96/7; 95/55; 95/56; 55/523; 55/DIG. 5; 427/585
(58) Field of Classification Search ....................... 96/4, 96/7, 11, 12; 95/55, 56; 55/523, 524, DIG. 5; 427/585
See application file for complete search history.

(56) References Cited

U.S. PATENT DOCUMENTS

| | | | | |
|---|---|---|---|---|
| 4,268,278 A * | 5/1981 | Dobo et al. | ..................... | 95/56 |
| 5,734,092 A | 3/1998 | Wang et al. | ................. | 73/23.25 |
| 5,782,959 A | 7/1998 | Yang et al. | ...................... | 96/11 |
| 6,899,744 B2 * | 5/2005 | Mundschau | .................... | 95/56 |
| 7,001,446 B2 * | 2/2006 | Roark et al. | .................... | 95/56 |
| 7,074,255 B2 * | 7/2006 | Meacham | ....................... | 95/55 |
| 2003/0183080 A1 | 10/2003 | Mundschau | .................... | 95/55 |
| 2007/0044662 A1* | 3/2007 | Song et al. | ....................... | 96/4 |

FOREIGN PATENT DOCUMENTS

| | | |
|---|---|---|
| EP | 1 258 283 A1 | 11/2002 |
| EP | 1 277 512 A1 | 1/2003 |
| JP | 07-000775 | 1/1995 |
| JP | 2002-336664 | 11/2002 |
| WO | WO 90/09231 | 8/1990 |

OTHER PUBLICATIONS

L. Huang, et al.; "Palladium Membranes Supported on Porous Ceramics Prepared by Chemical Vapor Deposition"; Thin Solid Films, 1997, vol. 302, pp. 98-101.

G. Xomeritakis, et al.; "Fabrication of a Thin Palladium Membrane Supported in a Porous Ceramic Substrate by Chemical Vapor Deposition"; Jounal of Membrane Science, 1996, vol. 120, pp. 261-272.

* cited by examiner

Primary Examiner—Jason M. Greene

(57) ABSTRACT

According to the present invention there is disclosed a hydrogen-permeable membrane which comprises
  a ceramic material composed of a nitride of aluminum (Al) and/or silicon (Si), an oxide of aluminum (Al) and/or silicon (Si), or a silicide of a rare earth element, and
  particles of at least one kind of hydrogen-permeable metal selected from palladium (Pd), niobium (Nb), vanadium (V), tantalum (Ta) and an alloy thereof, dispersed in the ceramic material,
wherein a proportion of the hydrogen-permeable metal particles in the hydrogen-permeable membrane is 30 to 70% by mass and a thickness of the membrane is 5 to 1,000 nm.

7 Claims, 6 Drawing Sheets

HYDROGEN-PERMEABLE MEMBRANE AND PROCESS FOR PRODUCTION THEREOF

TECHNICAL FIELD

The present invention relates to a hydrogen-permeable membrane and a process for production thereof. More particularly, the present invention relates to a hydrogen-permeable membrane which can selectively pass hydrogen contained in, for example, the fuel hydrogen flowing through the inside of fuel cell for automobile, fuel cell for household use, portable fuel cell, etc. and thereby can provide hydrogen gas of higher purity, as well as to a process for producing such a hydrogen-permeable membrane.

BACKGROUND ART

The demand for hydrogen is predicted to increase sharply in various industrial fields. With such a background, development of a hydrogen-permeable membrane usable for purification of hydrogen is in progress. As the hydrogen-permeable membrane, there is known one using palladium (Pd). Pd is a rare noble metal and is very expensive.

Hence, development of a substitute material which is less expensive than Pd. For example, there was proposed, in the claim of JP-A-2002-336664, a hydrogen-permeable membrane unit obtained by forming a hydrogen-permeable membrane composed of niobium (Nb), vanadium (V), tantalum (Ta), etc., on a porous substrate having gas permeability. There was proposed, in the claim of JP-A-1995-000775, a hydrogen-permeable membrane using an alloy of zirconium (Zr) with nickel, chromium, iron, copper, vanadium, titanium, etc.

However, substitute materials for Pd are, in general, inferior to Pd in hydrogen permeability. Further, the substitute materials react with hydrogen and resultantly powder, and show such deterioration. Therefore, they are inferior to Pd in durability.

Moreover, hydrogen-permeable membranes using Pd or a substitute material as a hydrogen-permeable material have a membrane thickness of about several microns to several millimeters and only hydrogen-permeable membranes having such a very large thickness have been developed heretofore. In particular, a hydrogen-permeable membrane using only Pd as a membrane material has a low mechanical strength and accordingly has a problem that the thickness can not be reduced further. Since hydrogen-permeable materials and, in particular, Pd is very expensive, a hydrogen-permeable membrane of large thickness composed of such a material becomes a high cost.

Thus, there is currently no hydrogen-permeable membrane which can satisfy three elements of performance, durability and cost and it is strongly desired to develop such a hydrogen-permeable membrane.

DISCLOSURE OF THE INVENTION

The present invention has been made in view of the above situation and aims at providing a hydrogen-permeable membrane which is high in hydrogen permeability, low in deterioration caused by reaction with hydrogen, superior in durability, very small in membrane thickness, superior in mechanical strength, and inexpensive, as well as providing a process for producing such a hydrogen-permeable membrane.

The present invention is as follows.

[1] A hydrogen-permeable membrane which comprises ceramic material composed of a nitride of aluminum (Al) and/or silicon (Si), an oxide of aluminum (Al) and/or silicon (Si), or a silicide of a rare earth element, and
particles of at least one kind of hydrogen-permeable metal selected from palladium (Pd), niobium (Nb), vanadium (V), tantalum (Ta) and an alloy thereof, dispersed in the ceramic material,
wherein a proportion of the hydrogen-permeable metal particles in the hydrogen-permeable membrane is 30 to 70% by mass and a thickness of the membrane is 5 to 1,000 nm.

[2] The hydrogen-permeable membrane according to [1], wherein the hydrogen-permeable metal is Pd or an alloy thereof.

[3] The hydrogen-permeable membrane according to [1], wherein the ceramic material is at least one kind selected from $AlNx_1$, $AlOx_2$, $SiNx_3$ and $SiOx_4$ wherein $0.5 \leq x_1 \leq 1$, $0.8 \leq x_2 \leq 1.5$, $0.7 \leq x_3 \leq 1.3$ and $1 \leq x_4 \leq 2$.

[4] A hydrogen-permeable membrane unit comprising
a porous ceramic substrate, and
a hydrogen-permeable membrane according to any of [1] to [3], formed on at least one side of the substrate.

[5] The hydrogen-permeable membrane unit according to [4], wherein the porous ceramic substrate has pores of 1 to 200 nm in diameter.

[6] A process for producing a hydrogen-permeable membrane, which comprises forming a hydrogen-permeable membrane according to any of [1] to [3], on at least one side of a porous ceramic substrate by vapor-phase growth or sputtering.

[7] The process for producing a hydrogen-permeable membrane according to [6], wherein the porous ceramic substrate has pores of 1 to 200 nm in diameter.

The hydrogen-permeable membrane of the present invention comprises a hard ceramic material and hydrogen-permeable metal particles dispersed substantially uniformly in the ceramic material. Therefore, with this hard ceramic material, the mechanical stress caused by the volume change of the hydrogen-permeable metal particles taking place in their hydrogen absorption or release can be relaxed. Consequently, the present hydrogen-permeable membrane is low in deterioration caused by the reaction of hydrogen-permeable metal with hydrogen. Accordingly, the hydrogen-permeable membrane of the present invention is superior in durability.

The hydrogen-permeable membrane of the present invention is not a membrane formed using a hydrogen-permeable metal (e.g. Pd) alone but a membrane wherein hydrogen-permeable metal particles are dispersed substantially uniformly in a matrix composed of a ceramic material. The present hydrogen-permeable membrane can be formed on a porous substrate of high rigidity and, in this case, need not have a large mechanical strength; therefore, the membrane can have an extremely small thickness of 5 to 1,000 nm. Owing to the small membrane thickness, the present hydrogen-permeable membrane has hydrogen permeability about equal to a conventional hydrogen-permeable membrane using Pd alone, which has a large thickness for high mechanical strength. Further, the small thickness allows a small use amount of hydrogen-permeable metal and consequently enables production of a hydrogen-permeable membrane at a low cost.

The hydrogen-permeable membrane of the present invention has excellent permeability of hydrogen gas. It has no permeability to gases other than hydrogen, such as nitrogen, oxygen and the like. Therefore, the present hydrogen-perme-

In these figures, 1 is a hydrogen-permeable membrane; 3 is a hydrogen-permeable membrane unit; 11 is hydrogen-permeable metal particles; 13 is a ceramic material; 23 is a ceramic substrate; 25 is a sealing material; 27 is a stainless steel holder; 31 is a cell for mixed gas; 33 is an injection hole for mixed gas; 35 is a suction hole for mixed gas; 37 is a pressure sensor for mixed gas; 41 is a cell for gas after permeation; 43 is a sampling hole for gas after permeation; 45 is a suction hole for gas after permeation; and 47 is a pressure sensor for gas after permeation.

BEST MODE FOR CARRYING OUT THE INVENTION

The present invention is described in detail below with referring to the attached drawings.

Figure 1:
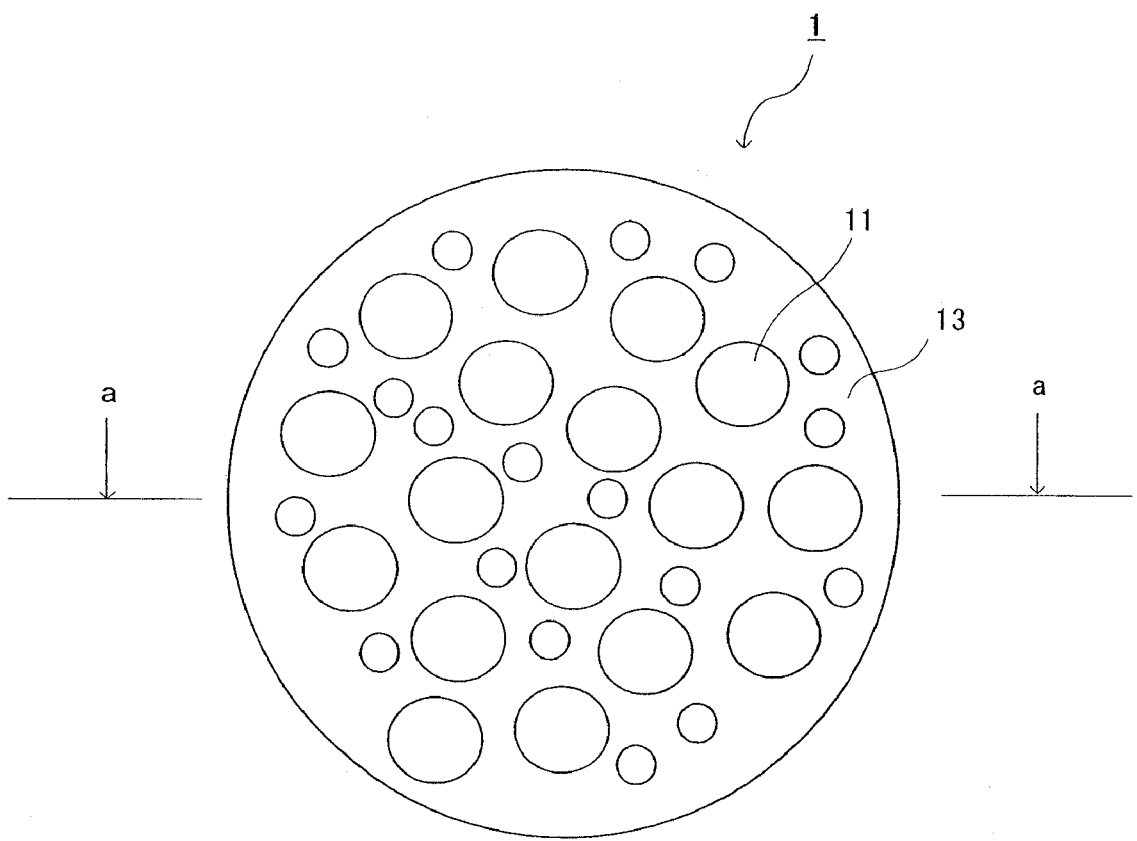
FIG. 1 is a plan view showing an example of the hydrogen-permeable membrane of the present invention.

FIG. 1 is a plan view showing an example of the hydrogen-permeable membrane of the present invention. In FIG. 1, 1 is a hydrogen-permeable membrane. 11 is particles of a hydrogen-permeable metal and is dispersed in a ceramic material 13 (a matrix) substantially uniformly. The diameters of the hydrogen-permeable metal particles 11 is 1 to 10 nm, preferably 2 to 8 nm, more preferably 3 to 6 nm and is smaller than the thickness of the hydrogen-permeable membrane 1.

Figure 2:
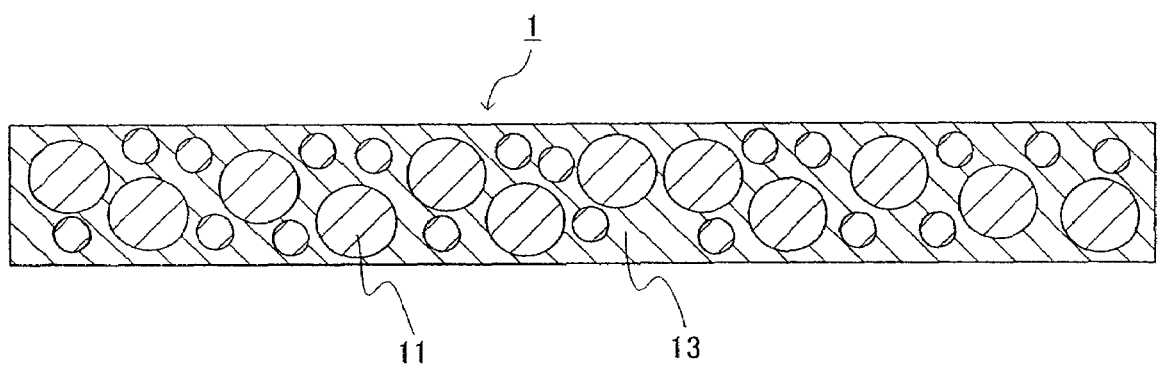
FIG. 2 is a sectional view taken along the a-a line of FIG. 1.

FIG. 2 shows a section of FIG. 1 along an a-a line. The numerals in FIG. 2 are the same as in FIG. 1. The thickness of the hydrogen-permeable membrane is preferably 5 to 1,000 nm.

Figure 3:
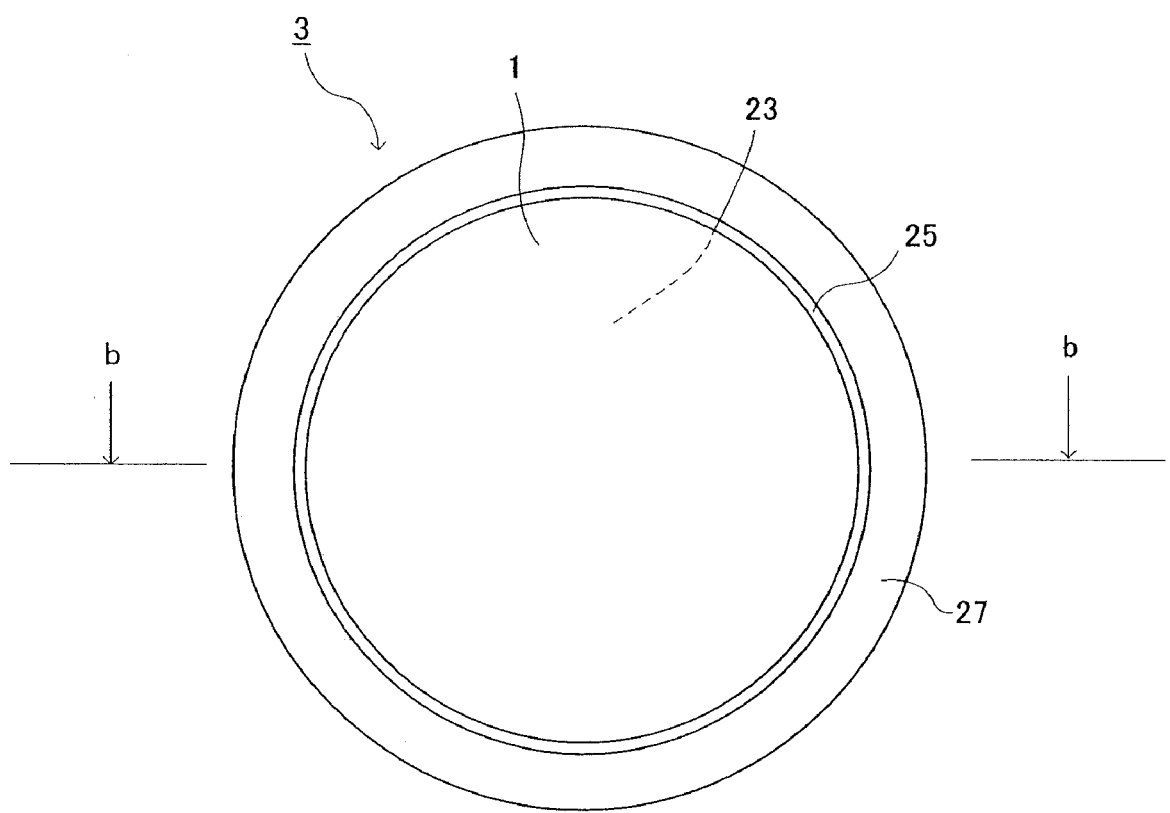
FIG. 3 is a plan view showing an example of the hydrogen-permeable membrane unit of the present invention.

FIG. 3 is a plan view showing an example of the hydrogen-permeable membrane unit of the present invention wherein a hydrogen-permeable membrane is fitted to a holder. In FIG. 3, 3 is a hydrogen-permeable membrane unit; 27 is a stainless steel holder; 23 is a porous ceramic substrate fitted to the stainless steel holder 27; and 1 is a hydrogen-permeable membrane and is formed on one side of the porous ceramic substrate 23. 25 is a sealing material for filling the gap between the porous ceramic substrate 23 and the stainless steel holder 27 gas-tightly. As the method for sealing, there can be mentioned, for example, a brazing method using a brazing material, such as high-melting metal method, active metal method or the like. Therefore, as the sealing material, there is used a material used in such a sealing method. Sealing may be conducted using an inorganic adhesive. The sealing material 25 fills the above-mentioned gap with no space left. Incidentally, as the porous ceramic substrate, there can be used, for example, a commercial product having pores of about 5 nm in diameter.

Figure 4:
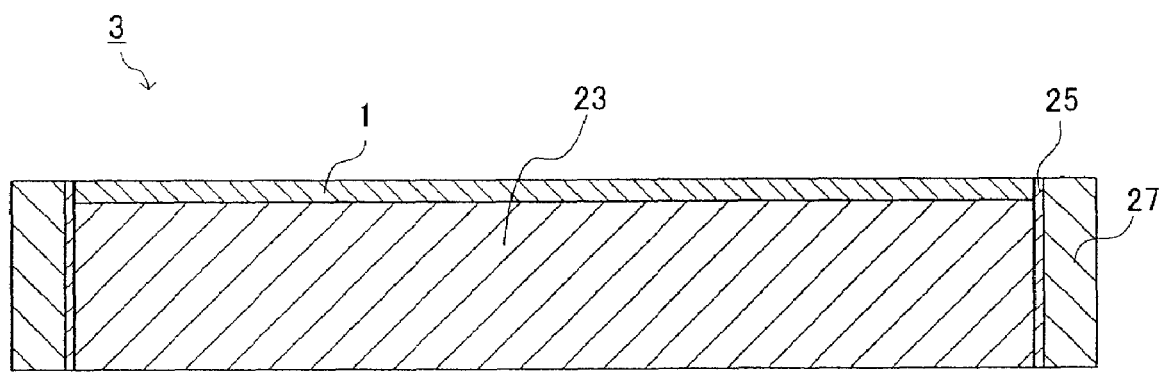
FIG. 4 is a sectional view taken along the b-b line of FIG. 3.

FIG. 4 shows a section of FIG. 3 along a b-b line. The numerals in FIG. 4 are the same as in FIG. 3.

Figure 5:
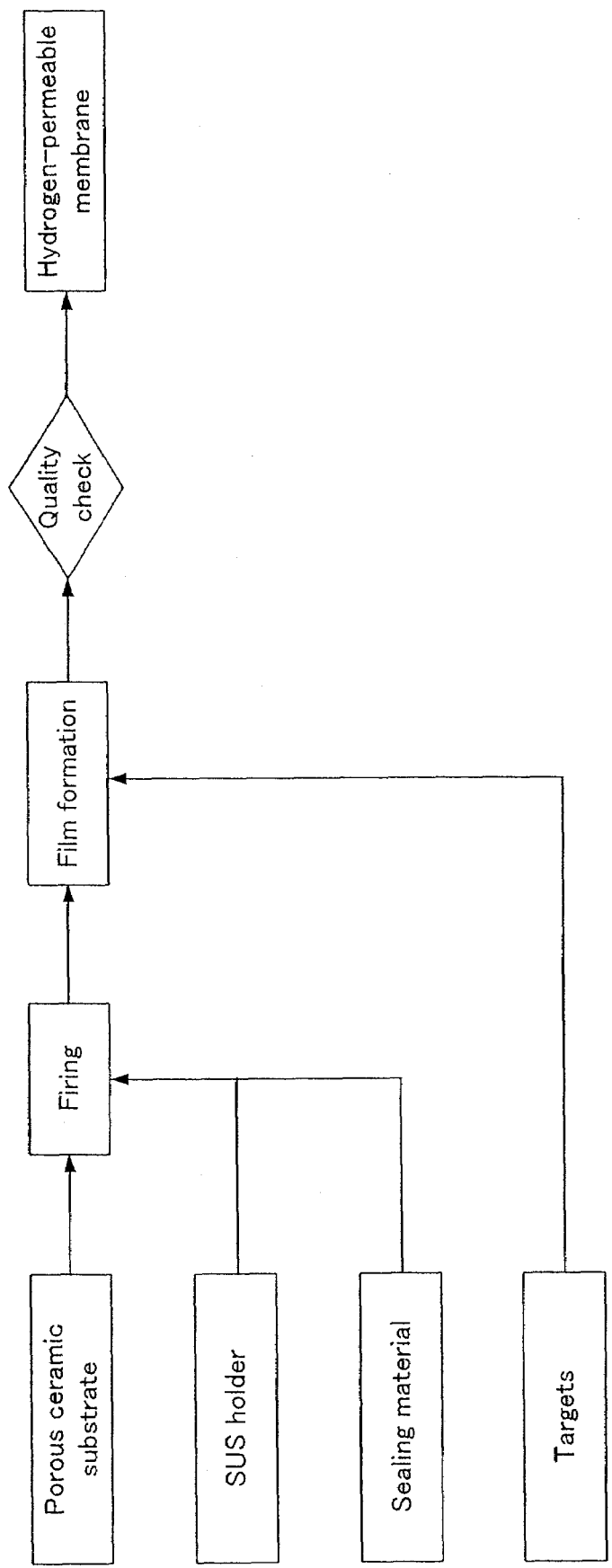
FIG. 5 is a flow chart showing an example of the process for producing a hydrogen-permeable membrane unit according to the present invention.

FIG. 5 is a flow chart showing an example of the process for producing a hydrogen-permeable membrane unit according to the present invention. First, a porous ceramic substrate is fitted to a stainless steel holder; the gap between them is filled with a sealing material (a brazing material); then, they are fired. Thereby, the porous ceramic substrate and the stainless steel holder are integrated. Then, a target composed of a hydrogen-permeable metal or an alloy thereof and a target composed of a raw material of ceramic are placed in a high-frequency magnetron sputtering apparatus. Then, sputtering is conducted in an atmosphere of nitrogen gas and/or oxygen gas. Thereby is formed, on one side of the porous ceramic substrate, a hydrogen-permeable membrane wherein particles of the hydrogen-permeable metal or alloy thereof are dispersed in a matrix composed of the ceramic material. The thus-obtained hydrogen-permeable membrane unit is subjected to quality check as necessary and, when there is no problem in quality, is used as a product of hydrogen-permeable membrane unit.

Figure 6:
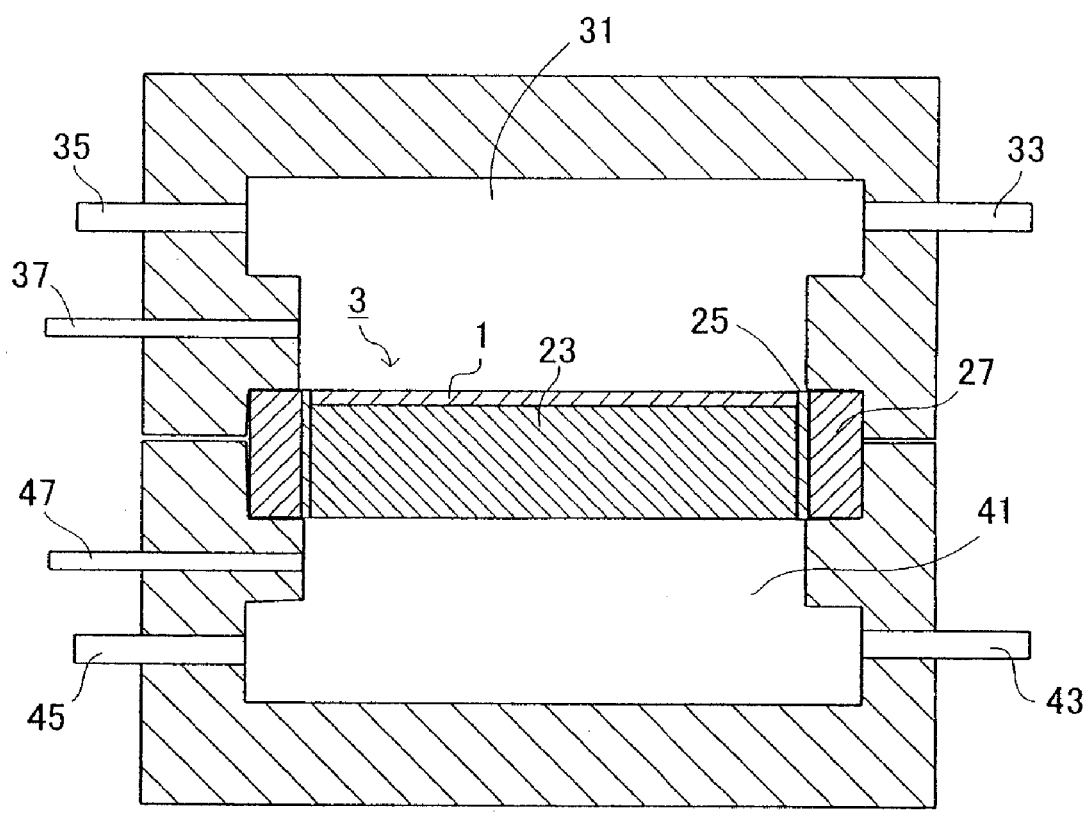
FIG. 6 is a sectional view showing a hydrogen permeability tester.

FIG. 6 is a sectional view of a hydrogen permeability tester used in the Examples of the present invention. In FIG. 6, 31 is a cell for mixed gas; 33 is an injection hole for a to-be-tested mixed gas fed to the mixed gas cell; 35 is a suction hole for mixed gas in mixed gas cell; 37 is a pressure sensor; 41 is a cell for gas after permeation; 43 is a sampling hole for gas after permeation; 45 is a suction hole for gas after permeation in cell 41; and 47 a sensor for pressure in cell 41. The other numerals shown in FIG. 6 are the same as the numerals shown in FIG. 3.

Hydrogen-Permeable Metal Particles

The hydrogen-permeable metal particles 11 used in the present invention are particles of at least one kind selected from palladium (Pd), niobium (Nb), vanadium (V), tantalum (Ta) and an alloy thereof. The hydrogen-permeable metal particles may be dispersed in the ceramic material as metal element particles or as alloy particles. The alloy of hydrogen-permeable metal, used in the present invention is an alloy which has been used heretofore as a material for hydrogen-permeable membrane. As the alloy of hydrogen-permeable metal, there can be mentioned, for example, an alloy of the above-mentioned hydrogen-permeable metal with a metal such as calcium, iron, copper, vanadium, nickel, titanium, chromium, zirconium or the like.

As the hydrogen-permeable metal particles, Pd particles and Pd alloy particles are particularly preferred for their superior hydrogen permeability.

In the hydrogen-permeable membrane of the present invention, the hydrogen-permeable metal particles are preferred to be dispersed uniformly in the ceramic material. The content of the hydrogen-permeable metal particles in the hydrogen-permeable membrane is preferably 30 to 70% by mass, more preferably 35 to 60% by mass, particularly preferably 38 to 50% by mass. When the content is less than 30% by mass, insufficient hydrogen permeability results. Meanwhile, when the content is more than 70% by mass, the deterioration of hydrogen-permeable membrane caused by reaction with hydrogen is striking during use of the hydrogen-permeable membrane. Also when the content is more than 70% by mass, the hydrogen-permeable membrane has insufficient mechanical strength, making it difficult to obtain a hydrogen-permeable membrane having a thickness of 5 to 1,000 nm.

Ceramic Material

In the present invention, the ceramic material 13 constituting the matrix of the hydrogen-permeable membrane 1 is composed of a nitride of aluminum (Al) and/or silicon (Si), an oxide of aluminum (Al) and/or silicon (Si), or a silicide of a rare earth element. As specific examples of such a ceramic material, there can be mentioned $AlNx_1$, $AlOx_2$, $SiNx_3$ and $SiOx_4$ wherein $0.5 \leq x_1 \leq 1$, $0.8 \leq x_2 \leq 1.5$, $0.7 \leq x_3 \leq 1.3$ and $1 \leq x_4 \leq 2$.

As the silicide of a rare earth element, there can be mentioned silicides of yttrium (Y), lanthanum (La), etc.

Of these ceramic materials, $AlNx_1$ is hard and also superior in strength. Therefore, $AlNx_1$ can suppress the powdering caused by the reaction of hydrogen-permeable metal or alloy thereof with hydrogen and is particularly preferable.

Thickness of Hydrogen-Permeable Membrane

The hydrogen-permeable membrane 1 of the present invention has a thickness of 5 to 1,000 nm, preferably 10 to 500 nm. When the thickness is less than 5 nm, the hydrogen-permeable membrane has insufficient strength. Meanwhile, when the thickness is more than 1,000 nm, the hydrogen-permeable membrane has insufficient hydrogen permeability and further is low in cost reduction effect brought about by the saving of use amount of hydrogen-permeable metal.

Incidentally, when Pd is used as the hydrogen-permeable metal, the thickness of the hydrogen-permeable membrane can be made very small because Pd is superior in separability of hydrogen from other gases.

Porous Ceramic Substrate

The porous ceramic substrate 23 used in the present invention has gas permeability owing to the pores present inside the substrate. As the porous ceramic substrate, there can be used one ordinarily available in the market. The pores present in the porous ceramic substrate have diameters of preferably 1 to 200 nm, more preferably 5 to 100 nm. When the pore diameters are less than 1 nm, the hydrogen-permeable membrane has insufficient hydrogen permeability. Meanwhile, when the pore diameters are more than 200 nm, the hydrogen-permeable membrane may have insufficient separability of hydrogen from other gases (e.g. nitrogen gas). Incidentally, the pores in the porous ceramic substrate are preferably continuous.

Process for Production of Hydrogen-Permeable Membrane

The hydrogen-permeable membrane of the present invention can be obtained by forming, on at least one side of a porous ceramic substrate 23, a thin film composed of a mixture of a ceramic material and a hydrogen-permeable metal or an alloy thereof. This film formation is conducted preferably by vapor-phase growth or sputtering.

The vapor-phase growth of the hydrogen-permeable membrane is a film formation method which comprises heating, for example, Pd metal and Al metal in a nitrogen gas atmosphere to deposit, on a substrate composed of a ceramic or the like, a mixture of Pd (a hydrogen-permeable metal particle) and AlN (a ceramic material) in a thin film state.

EXAMPLES

Then, the present invention is described more specifically by way of Examples. However, the present invention is in no way restricted by these Examples.

Example 1

A hydrogen-permeable membrane was formed on a porous ceramic substrate using a high-frequency magnetron sputtering apparatus. In FIG. 3 is shown the produced hydrogen-permeable membrane unit.

First, in a high-frequency magnetron sputtering apparatus were placed a porous ceramic substrate fitted inside a stainless steel holder, an Al target, and a Pd chip (a target) placed on the Al target. Then, the pressure inside the apparatus was reduced to about $4 \times 10^{-5}$ Pa. As the porous ceramic substrate, there was used one which was fitted to a stainless steel holder, and the gap between the substrate and the holder was filled with a sealing material (a brazing material). Then, argon gas and nitrogen gas (volume ratio: 85/15) were introduced into the apparatus until a pressure of 9.3 Pa was reached, and sputtering was conducted at room temperature. As a result, a hydrogen-permeable membrane having a thickness of 10 nm was formed on one side of the porous ceramic substrate. In the formed hydrogen-permeable membrane, Pd was uniformly dispersed in diameters of 2 to 6 nm in a $AlNx_1$ ($x_1$=0.9) matrix. The content of Pd in the hydrogen-permeable membrane was abut 40% by mass.

Then, the hydrogen-permeable membrane unit was fitted to a hydrogen permeability tester shown in FIG. 6 to examine the hydrogen permeability of the unit. First, the atmosphere in a mixed gas cell 31 of the hydrogen permeability tester was sucked from a suction hole 35 for mixed gas and the atmosphere in a cell 41 for gas after permeation was sucked from a suction hole 45 for gas after permeation. Suction was stopped when the pressure in the mixed gas cell 31 and the cell 41 for gas after permeation became $1 \times 10^{-6}$ Pa.

Then, hydrogen gas and nitrogen gas (volume ratio=70/30) were injected from an injection hole 33 for mixed gas. While the pressure inside the mixed gas cell 31 was kept at $2 \times 10^{-5}$ Pa and the temperature of the whole hydrogen permeability tester was kept at 300° C., the suction hole 45 for gas after permeation was kept in a reduced pressure and the amounts of hydrogen gas and nitrogen gas discharged from the suction hole 45 were measured. As a result, the permeation amount of hydrogen gas was $7 \times 10^{-7}$ mol/m$^2$/s/Pa. There was substantially no detection of nitrogen gas. This indicated that the selectivity of $H_2/N_2$ was 3,500 or more.

Example 2

Using the hydrogen-permeable membrane unit obtained in Example 1, the same hydrogen permeability test as in Example 1 was repeated 10 times. Then, the hydrogen-permeable membrane unit was taken out from the hydrogen permeability tester to observe the surface of the hydrogen-permeable membrane. As a result, no deterioration such as crack was seen on the surface of the hydrogen-permeable membrane.

Comparative Example 1

A hydrogen-permeable membrane unit was produced in the same operation as in Example 1 except that no Al chip (no Al target) was placed in the high-frequency magnetron sputtering apparatus. As a result, a hydrogen-permeable membrane having a thickness of 10 nm was formed on one side of a porous ceramic substrate. The formed hydrogen-permeable membrane was composed of Pd alone. Using the hydrogen-permeable membrane unit obtained, the same hydrogen permeability test as in Example 1 was repeated 3 times. Then, the hydrogen-permeable membrane unit was taken out from the hydrogen permeability tester to observe the surface of the hydrogen-permeable membrane. Cracks were seen on the surface of the hydrogen-permeable membrane.

Incidentally, the measurement of the thickness of hydrogen-permeable membrane was made using a stylus profile measuring system, and the measurement of composition of hydrogen-permeable membrane was made using an EPMA (an electron probe microanalyzer).

What is claimed is:

1. A hydrogen-permeable membrane which comprises
   a ceramic material composed of a nitride of aluminum (Al) and/or silicon (Si), an oxide of aluminum (Al) and/or silicon (Si), an oxide of aluminum (Al) and/or silicon (Si), or a silicide of a rare earth element, and
   particles of a least one kind of hydrogen-permeable metal selected from the group consisting of palladium (Pd), niobium (Nb), vanadium (V), tantalum (Ta) and an alloy thereof, dispersed in the ceramic material,
   wherein a proportion of the hydrogen-permeable metal particles in the hydrogen-permeable membrane is 30 to 70% by mass and a thickness of the membrane is 5 to 1,000 nm, and wherein the diameter of the particles is between 1 and 10 nm.

2. The hydrogen-permeable membrane according to claim 1, wherein the hydrogen-permeable metal is Pd or an alloy thereof.

3. The hydrogen-permeable membrane according to claim 1, wherein the ceramic material is at least one kind selected from the group consisting of $AlNx_1$, $AlOx_2$, $SiNx_3$ and $SiOx_4$ wherein $0.5 \leqq x_1 \leqq 1$, $0.8 \leqq x_2 \leqq 1.5$, $0.7 \leqq x_3 \leqq 1.3$ and $1 \leqq x_4 \leqq 2$.

4. A hydrogen-permeable membrane unit comprising
   a porous ceramic substrate, and
   a hydrogen-permeable membrane according to claim 1, formed on a least one side of the substrate.

5. The hydrogen-permeable membrane unit according to claim 4, wherein the porous ceramic substrate has pores of 1 to 200 nm in diameter.

6. A process for producing a hydrogen-permeable membrane, which comprises forming a hydrogen-permeable membrane according to claim 1, on at least one side of a porous ceramic substrate by vapor-phase growth or sputtering to form a thin film composed of a mixture of a ceramic material and a hydrogen-permeable metal or an alloy thereof.

7. The process for producing a hydrogen-permeable membrane according to claim 6, wherein the porous ceramic substrate has pores of 1 to 200 nm in diameter.

* * * * *